(12) United States Patent
Magadi

(10) Patent No.: US 12,291,125 B2
(45) Date of Patent: May 6, 2025

(54) BATTERY PACK SELECTION FOR PRE-CHARGING OF DC BUS

(71) Applicant: Cummins Inc., Columbus, IN (US)

(72) Inventor: Pramod Suresh Magadi, Indianapolis, IN (US)

(73) Assignee: CUMMINS INC., Columbus, IN (US)

( * ) Notice: Subject to any disclaimer, the term of this patent is extended or adjusted under 35 U.S.C. 154(b) by 285 days.

(21) Appl. No.: 17/796,804

(22) PCT Filed: Feb. 27, 2020

(86) PCT No.: PCT/US2020/020197
§ 371 (c)(1),
(2) Date: Aug. 1, 2022

(87) PCT Pub. No.: WO2021/173142
PCT Pub. Date: Sep. 2, 2021

(65) Prior Publication Data
US 2023/0050505 A1    Feb. 16, 2023

(51) Int. Cl.
*B60L 58/13* (2019.01)
*B60L 50/60* (2019.01)
(Continued)

(52) U.S. Cl.
CPC .............. *B60L 58/13* (2019.02); *B60L 50/66* (2019.02); *B60L 58/16* (2019.02); *B60L 58/21* (2019.02); *G01R 31/382* (2019.01); *H01M 10/425* (2013.01); *H02J 7/00038* (2020.01); *H01M 2010/4271* (2013.01)

(58) Field of Classification Search
CPC ...................................................... B60L 50/66
See application file for complete search history.

(56) References Cited

U.S. PATENT DOCUMENTS

| 7,701,177 | B2 | 4/2010 | Liu |
| 8,174,240 | B2 | 5/2012 | Yun |
| (Continued) | | | |

FOREIGN PATENT DOCUMENTS

| CN | 104426211 A | 3/2015 |
| CN | 106882059 A | 6/2017 |
| (Continued) | | |

OTHER PUBLICATIONS

International Search Report and Written Opinion for International patent application No. PCT/US2020/020197, filed Feb. 27, 2020, mailed May 22, 2020.

*Primary Examiner* — Eman A Alkafawi
*Assistant Examiner* — Suresh K Rajaputra
(74) *Attorney, Agent, or Firm* — Faegre Drinker Biddle & Reath LLP

(57) ABSTRACT

The present disclosure provides a system and method for selecting a battery pack that is used to pre-charge a high-voltage DC bus of an electric vehicle. A round-robin architecture is disclosed that prevents repeat selection of battery packs in order to prevent burnout of a resistor of the battery pack resulting from rapid subsequent pre-charging events. The system and method provided includes an easy solution that is scalable to a system with any number of battery packs, does not require any additional hardware, and is an inexpensive technique to protect an expensive component of the electric vehicle.

22 Claims, 7 Drawing Sheets

(51) Int. Cl.
*B60L 58/16* (2019.01)
*B60L 58/21* (2019.01)
*G01R 31/382* (2019.01)
*H01M 10/42* (2006.01)
*H02J 7/00* (2006.01)

(56) References Cited

U.S. PATENT DOCUMENTS

| | | |
|---|---|---|
| 8,766,602 B1 | 7/2014 | Kimes |
| 9,350,187 B2 | 5/2016 | Shreevani |
| 9,608,458 B2 | 3/2017 | Maltsev |
| 9,925,878 B2 | 3/2018 | Hashim |
| 9,925,933 B2 | 3/2018 | Hartl |
| 10,205,327 B2 * | 2/2019 | Okui ............... H02J 7/0025 |
| 2013/0175857 A1 | 7/2013 | Shreevani et al. |
| 2015/0061376 A1 | 3/2015 | Hartl et al. |
| 2015/0171638 A1 * | 6/2015 | Huang ............ H02J 7/0019 |
| | | 320/162 |
| 2015/0239366 A1 * | 8/2015 | Jestin ................ B60L 3/04 |
| | | 307/10.1 |
| 2016/0028263 A1 | 1/2016 | Yau |
| 2017/0166065 A1 * | 6/2017 | Hong ................ H02J 7/00 |
| 2017/0166075 A1 * | 6/2017 | Hong ................ B60L 58/12 |
| 2018/0026456 A1 | 1/2018 | Kang |
| 2020/0076210 A1 * | 3/2020 | Heyne ............... H02J 7/0013 |
| 2020/0274203 A1 * | 8/2020 | Kirleis ................ B60L 8/003 |
| 2021/0226267 A1 * | 7/2021 | Books ................ H02J 7/14 |

FOREIGN PATENT DOCUMENTS

| | | |
|---|---|---|
| WO | 2019/130054 A1 | 7/2019 |
| WO | 2019234348 A1 | 12/2019 |

* cited by examiner

BATTERY PACK SELECTION FOR PRE-CHARGING OF DC BUS

CROSS-REFERENCE TO RELATED APPLICATIONS

This application claims priority to International Patent Application No. PCT/US2020/020197, filed Feb. 27, 2020, the disclosure of which is hereby expressly incorporated by reference in its entirety.

TECHNICAL FIELD OF THE PRESENT DISCLOSURE

The present disclosure relates to the pre-charging of a DC bus in an electric or hybrid vehicle. More specifically, the present disclosure relates to a system and method of selecting a battery pack for pre-charging the DC bus of an electric or hybrid vehicle.

BACKGROUND OF THE PRESENT DISCLOSURE

In vehicles having multiple battery packs connected in a parallel configuration, pre-charging a high-voltage DC bus must be completed by at least one of the battery packs before any of the battery packs within the configuration can close their contactors to allow for vehicle operation. Each battery pack includes one pre-charge circuit comprising a resistor, which dissipates power through heat. As a result, overuse of a resistor causes the overused resistor to burnout.

Because each battery pack includes a single pre-charge circuit, using the same battery pack to pre-charge the high-voltage DC bus repeatedly in quick succession will damage the resistor, leading to an inoperable battery pack, which is expensive to replace and otherwise complicated to fix. This problem is particularly prevalent and significant in electric vehicles, especially where operator behavior determines how often pre-charging of the high-voltage DC bus will occur. For example, if the contactors in each battery pack must close with every key switch-on to operate the vehicle, the pre-charge of the high-voltage DC bus must occur with every key switch-on. To avoid premature resistor burnout and battery pack failure, solutions including additional hardware or software or hardware add-ons for individual battery packs have been proposed. However, these solutions are not ideal and improvements are desired.

SUMMARY OF THE PRESENT DISCLOSURE

The present disclosure provides a system and method for selecting a battery pack that is used to pre-charge a high-voltage DC bus of an electric vehicle. A round-robin architecture is disclosed that prevents repeat selection of battery packs in order to prevent burnout of a resistor of the battery pack resulting from rapid subsequent pre-charging events. The system and method provided includes an easy solution that is scalable to a system with any number of battery packs, does not require any additional hardware, and is an inexpensive technique to protect an expensive component of the electric vehicle.

In an embodiment of the present disclosure, a system for selecting a battery pack of a vehicle is disclosed. The system comprises a plurality of battery packs connected to each other in parallel; a controller operably coupled to the plurality of battery packs; a memory operably coupled to the controller; and a DC bus operably coupled to the plurality batter packs so that at least one of the plurality of battery packs is configured to selectively pre-charge the DC bus in a DC bus pre-charge event. The controller is configured to assemble a queue according to usage of the plurality of battery packs to pre-charge the DC bus and save the queue to the memory for subsequent usage.

A head of the queue may include a battery pack of the plurality of battery packs having a lowest state-of-charge than the remaining battery packs. The controller may be configured to receive a saved queue from the memory for a subsequent DC bus pre-charge event. The controller may be configured to receive a health index of any of one battery pack of the plurality of battery packs to determine if any one battery pack of the plurality of battery packs is faulty. A different queue may be assembled after every DC bus pre-charge event relative to an immediately previously used queue.

In another embodiment of the present disclosure, a method for selecting a battery pack for a vehicle is disclose, the method comprising retrieving a queue from a memory; requesting an identification of a battery pack positioned at a head of a queue; instructing the identified battery pack to complete pre-charge of a DC bus; and pushing the identified battery pack to a tail of the queue to create a second queue.

The method may further comprise determining whether the pre-charge of the Dc bus was successfully completed. When the pre-charge of the DC bus is not successfully completed, the method may further comprise requesting a second identification of a second battery pack positioned at a head of the second queue; instructing the second battery pack to complete pre-charge of the DC bus; determining whether pre-charge of the DC bus was successfully completed; pushing the second battery pack to a tail of the second queue to create a third queue; and repeating until the pre-charge of the DC bus is successfully completed. When the pre-charge of the DC bus is successfully completed, the method may further comprise initiating operation of the vehicle.

The method may further comprise reviewing a health index of the identified battery pack prior to instructing the identified battery pack to complete pre-charge of the DC bus to determine whether the identified battery pack is faulty. When the battery pack is faulty, the method may further comprise requesting a second identification of a second battery pack positioned at a head of the second queue; reviewing a health index of the second battery pack; and determining whether the second battery pack is faulty. When the second battery pack is faulty, the method may further comprise pushing the second battery pack to a tail of the second queue to create a third queue and repeating until an operable battery pack is identified. When the identified battery pack is operable, the method may further comprise initiating vehicle operation after the pre-charge of the DC bus is completed.

In yet another embodiment of the present disclosure, a method for selecting a battery pack for a vehicle is disclosed, the method comprising: identifying a battery pack of a plurality of battery packs having a lowest state-of charge than the remaining battery packs; instructing the identified battery pack to pre-charge a DC bus; storing the identified battery pack within a memory; creating a queue, wherein the identified battery pack is positioned at a head of the queue; and pushing the identified battery pack to a tail of the queue to create a subsequent queue. The method may further comprise reviewing a health index of the identified battery pack to determine whether the identified battery pack is faulty.

Additional features and advantages of the present disclosure will become apparent to those skilled in the art upon consideration of the following detailed description of the illustrative embodiments exemplifying the disclosure as presently perceived.

BRIEF DESCRIPTION OF THE DRAWINGS

The detailed description of the drawings particularly refers to the accompanying figures in which.

Figure 1:
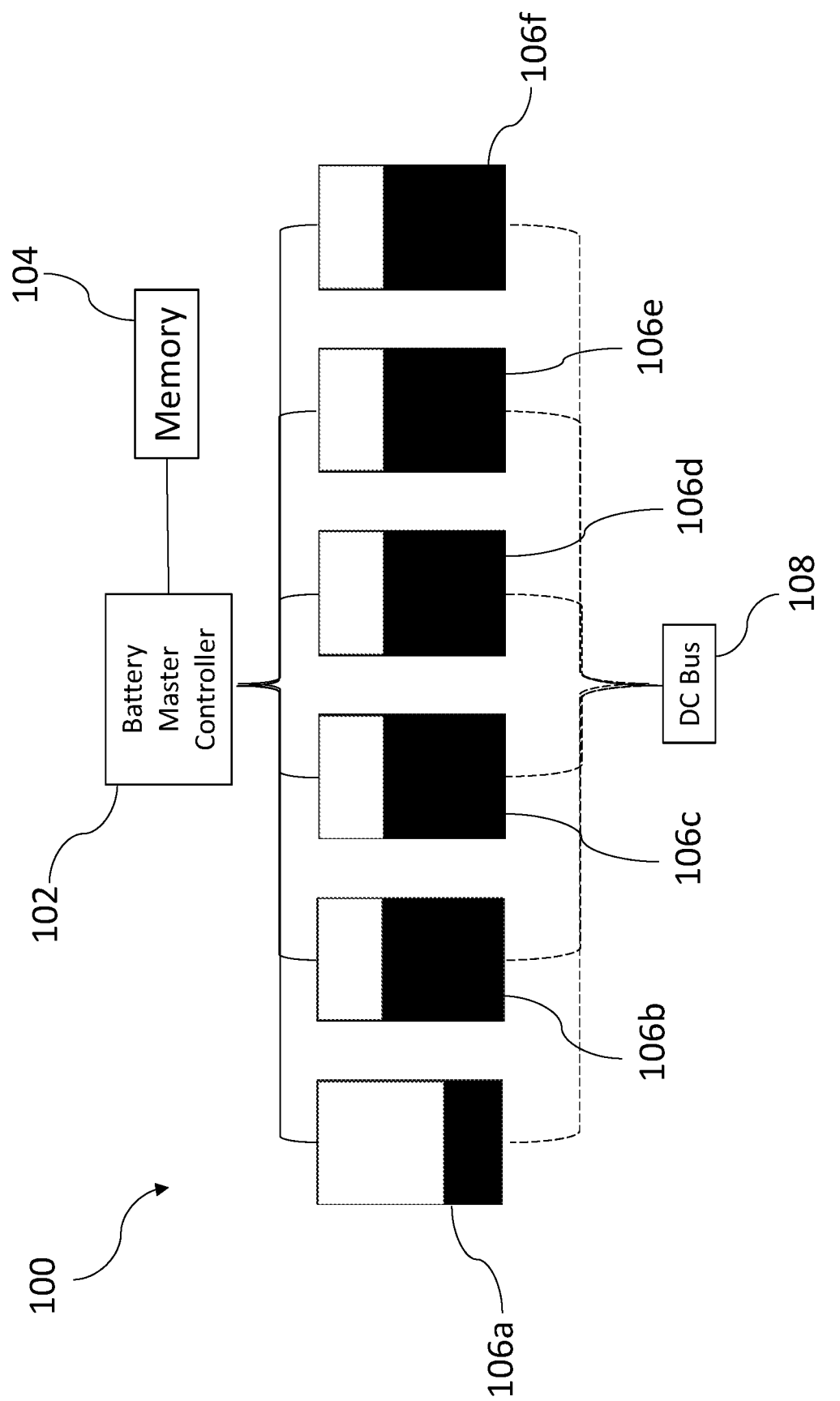
FIG. 1 illustrates an exemplary system of the present disclosure for pre-charging a high-voltage DC bus, the system including a plurality of battery packs connected in parallel, a controller, and a memory.

Corresponding reference characters indicate corresponding parts throughout the several views. Although the drawings represent embodiments of various features and components according to the present disclosure, the drawings are not necessarily to scale, and certain features may be exaggerated in order to better illustrate and explain the present disclosure. The exemplification set out herein illustrates an embodiment of the invention, and such an exemplification is not to be construed as limiting the scope of the invention in any manner.

DETAILED DESCRIPTION OF THE DRAWINGS

Referring initially to FIG. 1, a system 100 of a vehicle is disclosed. The system 100 includes a battery master controller 102, a non-volatile memory 104, and a plurality of battery packs 106, wherein the battery packs 106 are illustratively connected in a parallel configuration. Although the illustrated embodiment discloses six battery packs 106, the method and system described herein is scalable and can be applied to a vehicle with any number of battery packs 106. The battery packs 106 may have varying levels of state-of-charge percentages. For example, as shown, battery pack 106a may have a lower state-of-charge percentage than battery pack 106b. Any battery pack 106 may have a lower, higher, or equal state-of-charge percentage relative to any other battery pack 106.

The battery packs 106 are operably connected with the battery master controller 102 and selectively operably connected with a high-voltage DC bus 108, wherein the battery master controller 102 can communicate with each respective battery pack 106 to initiate pre-charge of the DC bus 108 using a selected battery pack 106 as discussed further herein. The battery master controller 102 may further communicate with each respective battery pack 106 to control the closing of contactors of the battery packs 106 for operation of the vehicle once pre-charge of the high-voltage DC bus 108 is complete. The battery master controller 102 is also operably connected to the memory 104 to store pre-charge events as discussed further herein.

Figure 2:
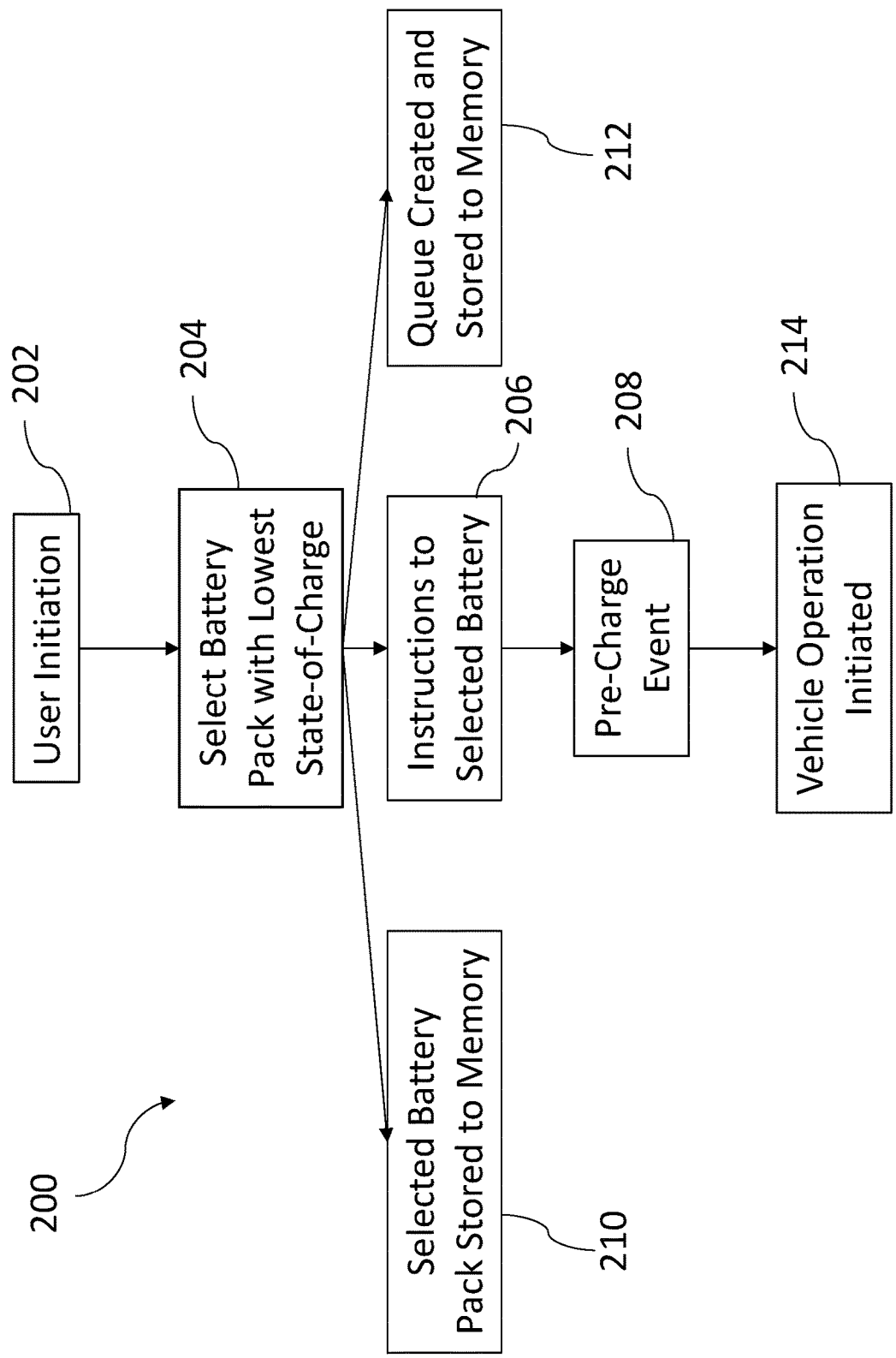
FIG. 2 illustrates an exemplary method of the present disclosure for selecting a battery pack from a plurality of battery packs connected in parallel to complete pre-charge of a high-voltage DC bus during a first vehicle operation initiation by a user.

Now referring to FIG. 2, in view of the components disclosed in FIG. 1, a method 200 for initiating a first DC bus pre-charge event is disclosed. At box 202, a user initiates operation of a vehicle. The user may initiate the pre-charge event using any method known in the art to initiate operation of a vehicle. For example, the user may utilize a switch, button, key-on using a standard key, remote start mechanism, use of a smart device application, use of a smart assistant, Bluetooth, key card, fingerprint identification, digital key, voice start, application of the Internet of things, or other mechanisms to initiate the pre-charge event. Before operation of the vehicle occurs, the DC bus 108 must be pre-charged using one of the plurality of battery packs 106.

After user initiation at box 202, the controller 102 identifies the battery pack 106 having the lowest state-of-charge percentage at box 204. For example, referring briefly to FIG. 1, the controller 102 chooses battery pack 106a, as battery pack 106a has the lowest state-of-charge percentage among the battery packs 106. Referring again to FIG. 2 in view of the components disclosed in FIG. 1, the controller 102 then sends instructions to the selected battery pack 106a at box 206 to pre-charge the DC bus 108 during the DC bus pre-charge event indicated at box 208. At any point after battery pack 106 selection at box 204, the controller 102 stores the identity of the pack 106a within the memory 104 to track the completion of the pre-charge event at box 210. At box 212, at any point after battery pack 106 selection at box 204 the controller 102 additionally creates a queue 302 (FIG. 3), which is stored in the memory 104 as indicated by box 212. Once the pre-charge event is completed, vehicle operation is initiated at box 214. Ideally, the contactors of the remaining battery packs 106 are closed to allow full vehicle operation at box 214.

However, such contactors are only closed upon determination by the controller 102 that the remaining battery packs 106 are operable as further discussed herein. In some instances, any number of battery packs 106 fewer than the remaining battery packs 106 may be determined by the controller 102 to be non-operable. If any battery packs 106 are considered non-operable, the contactors of only the operable battery packs 106 are closed for vehicle operation. In the event less than all of the battery packs 106 are operable, the vehicle operates at a performance percentage corresponding to the percentage of battery packs 106 that are operable.

Figure 3:
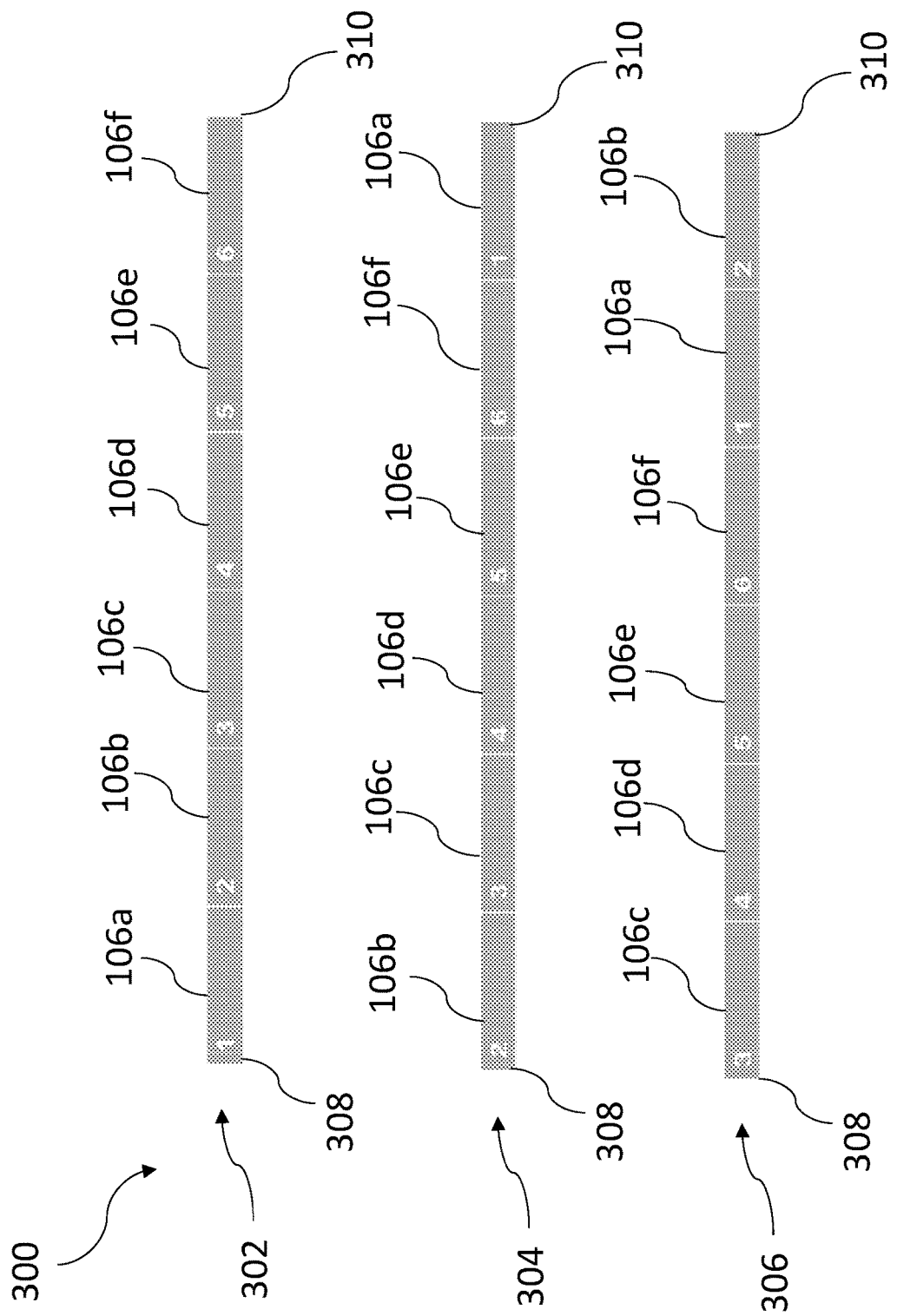
FIG. 3 illustrates exemplary queues for selecting a battery pack from a plurality of battery packs connected in parallel.

FIG. 3 illustrates a round robin architecture 300, including the mentioned queue 302 and additional queues 304, 306 that are generated with repeat instances of user initiation. For example, referring to FIGS. 1-3, after the controller 102 chooses the battery pack 106 having the lowest state-of-charge percentage (i.e. battery pack 106a) at box 204 of the method 200, the controller 102 generates the queue 302 as mentioned above. Because battery pack 106a is the first selected battery pack, battery pack 106a is initially positioned at the head 308 of the queue 302. Upon pre-charge of the DC bus 108, the controller 102 instructs the memory 104 to move the battery pack 106a is to the tail 310 of the queue, as shown by queue 304, to avoid immediate repeat use of the battery pack 106a with the next user initiation. For example, if the memory 104 has queue 304 stored for use upon next user initiation, the next user initiation will cause the controller 102 to instruct the battery pack 106b to pre-charge the DC bus. Upon pre-charge of the DC bus 108, the controller 102 instructs the memory to move the battery pack 106b to the tail 310 of the queue, as shown by queue 306, to avoid immediate repeat use of the battery pack 106b with the next user initiation. The controller 102 continues to instruct the battery pack 106 at the head 308 of the queue in such a matter until all battery packs 106 have been utilized for a DC bus pre-charge event. At that period, the queue restarts and battery pack 106a is again selected.

Figure 4A:
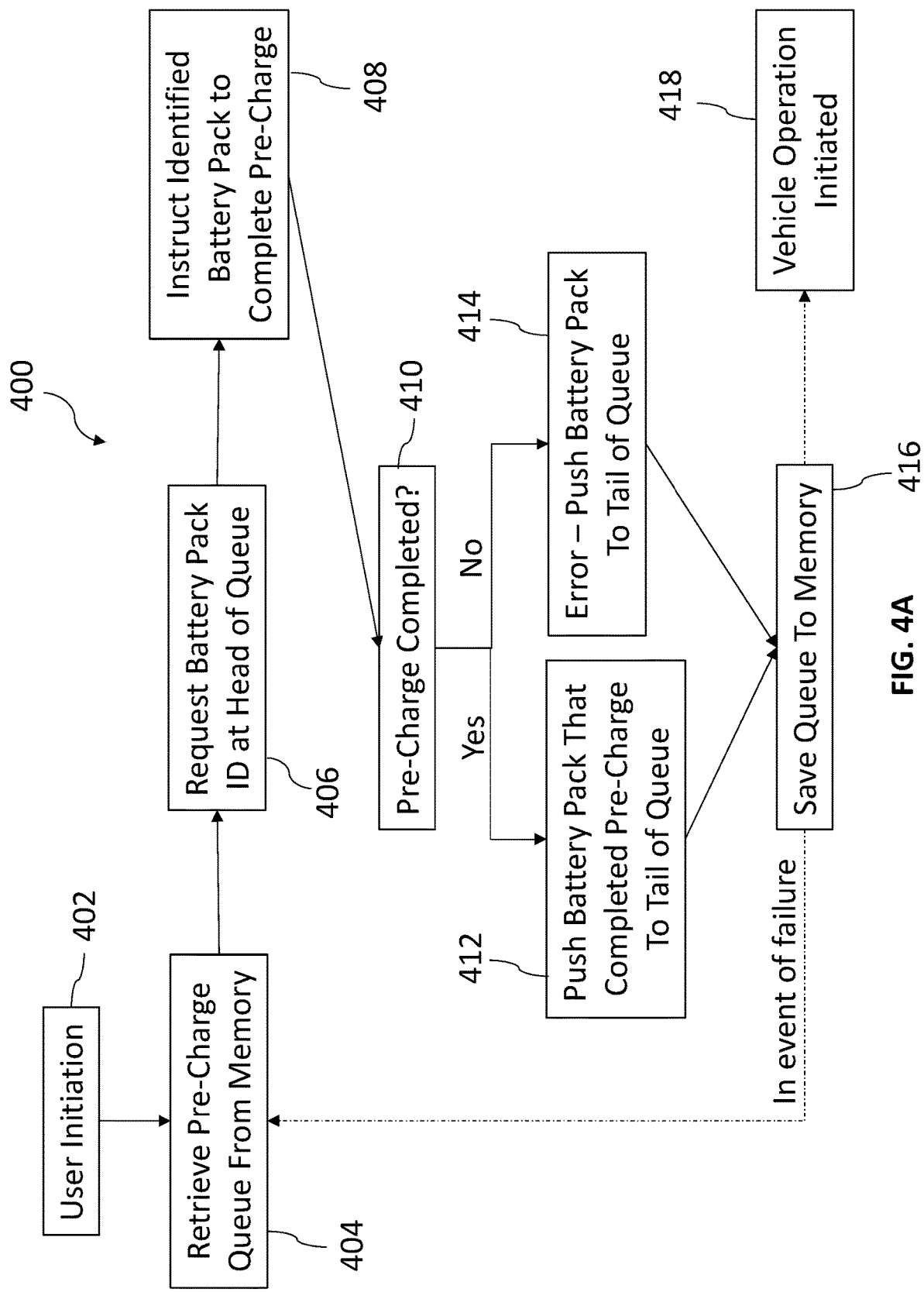
FIG. 4A illustrates an exemplary method of the present disclosure for selecting a battery pack from a plurality of battery packs connected in parallel to complete pre-charge of a high-voltage DC bus during subsequent vehicle operation initiations by the user.

Now referring to FIG. 4A in view of the components of FIGS. 1 and 3, a method 400 is provided for completing subsequent DC bus pre-charge events, following the initial DC bus pre-charge event method 200 of FIG. 2. In other words, method 200 is used for the first user initiation of a vehicle, i.e. first vehicle use, first vehicle use after a system reset, first vehicle use after a component of the system has been replaced, or any other instance in which a queue is not saved to memory. After the completion of method 200, subsequent user initiation events cause initiation of method 400 of FIG. 4A until circumstances require a system reset or other event which dictates the use of method 200.

Method 400 begins at box 402, when a user initiates operation of a vehicle. User initiation may occur in any of the ways discussed herein in reference to method 200. After user initiation at box 402, the controller 102 retrieves the queue (i.e. any of queues 302, 304, 306 or another, subsequent queue) from the memory 104 at box 404. Identification of the battery pack 106 at the head 308 of the queue is also requested at box 406. Once the proper battery pack 106 has been identified at box 404, the controller 102 instructs the respective battery pack 106 to complete pre-charge of the DC bus 108 at box 408. After a predetermined period of time in which the pre-charge event should be completed, the controller 102 determines whether the pre-charge of the DC bus 108 has been completed at box 410.

If the pre-charge event has been completed at box 410, the battery pack 106 used during the pre-charge event is pushed to the tail 310 of the queue at box 412, and the resulting queue is saved to the memory 104 at box 416. If the pre-charge event has not been completed at box 410, a pre-charge error has occurred and the faulty battery pack 106 is pushed to the tail 310 of the queue at box 414. The resulting queue is saved to the memory 104 at box 416 and the method 400 restarts at box 404 until the pre-charge event is successfully completed. Once the pre-charge event is successfully completed, the contactors of the remaining operable battery packs 106 are closed to allow vehicle operation at box 418 as discussed above.

Figure 4B:
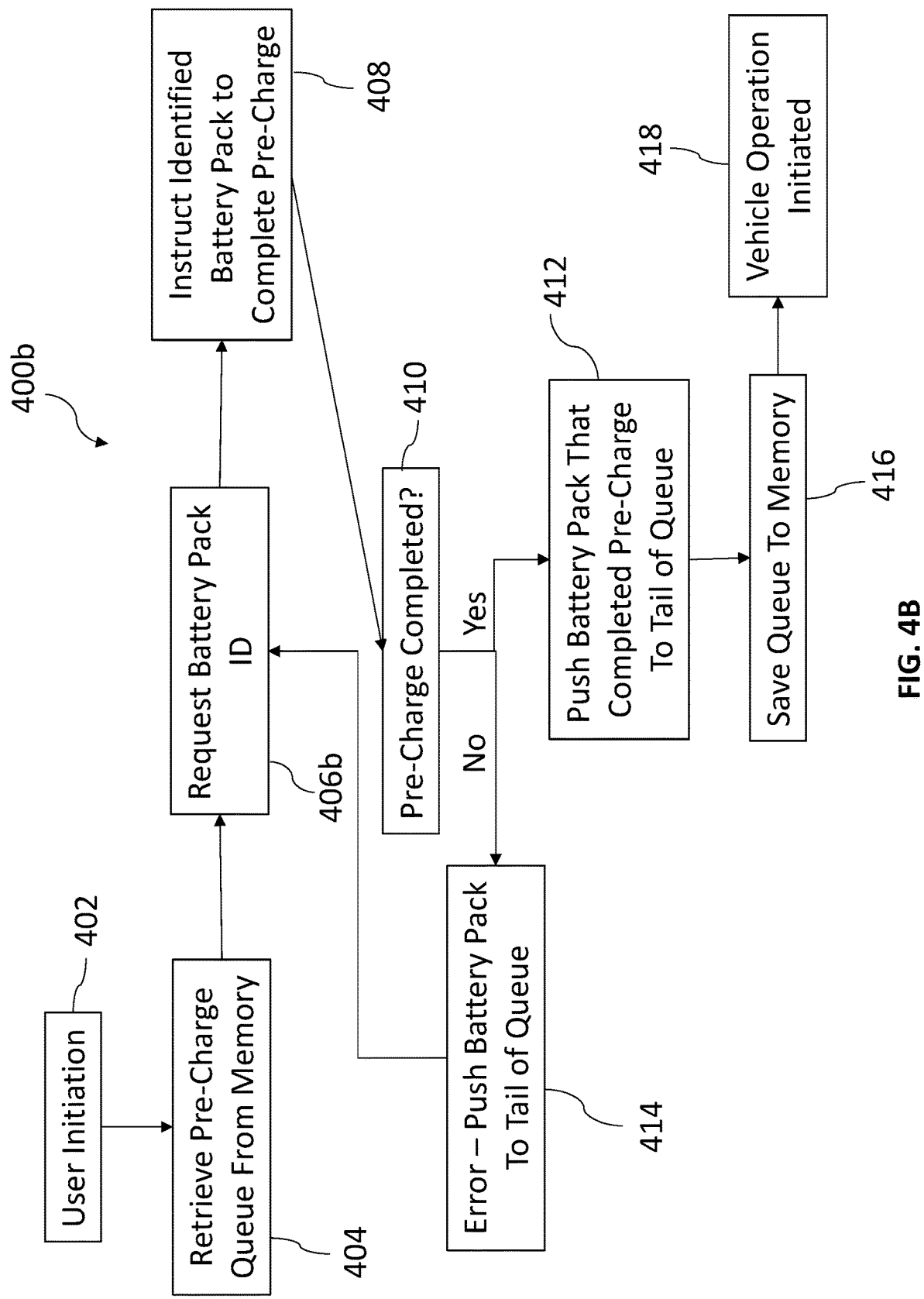
FIG. 4B illustrates another embodiment of the exemplary method of FIG. 4A.

In some embodiments, as shown by FIG. 4B, a method 400b may be utilized. Method 400b is substantially the same as method 400 illustrated by FIG. 4A, with the exceptions described herein. In method 400b, if the pre-charge event has not been completed at box 410, the processor 102 may immediately retrieve identification of the next battery pack 106 at box 406b, which simultaneously pushes the faulty battery pack 106 to the tail 310 of the queue as shown at box 414. The method 400b repeats until the pre-charge event is successfully completed at box 410. Once the pre-charge event is successfully completed, the battery pack 106 used during the pre-charge event is pushed to the tail 310 of the queue at box 412, and the resulting queue is saved to memory at box 416. The contactors of the remaining operable battery packs 106 are closed to allow vehicle operation at box 418 as discussed above. Utilization of method 400b may result in greater efficiency when pre-charging the DC bus of the vehicle.

Figure 5A:
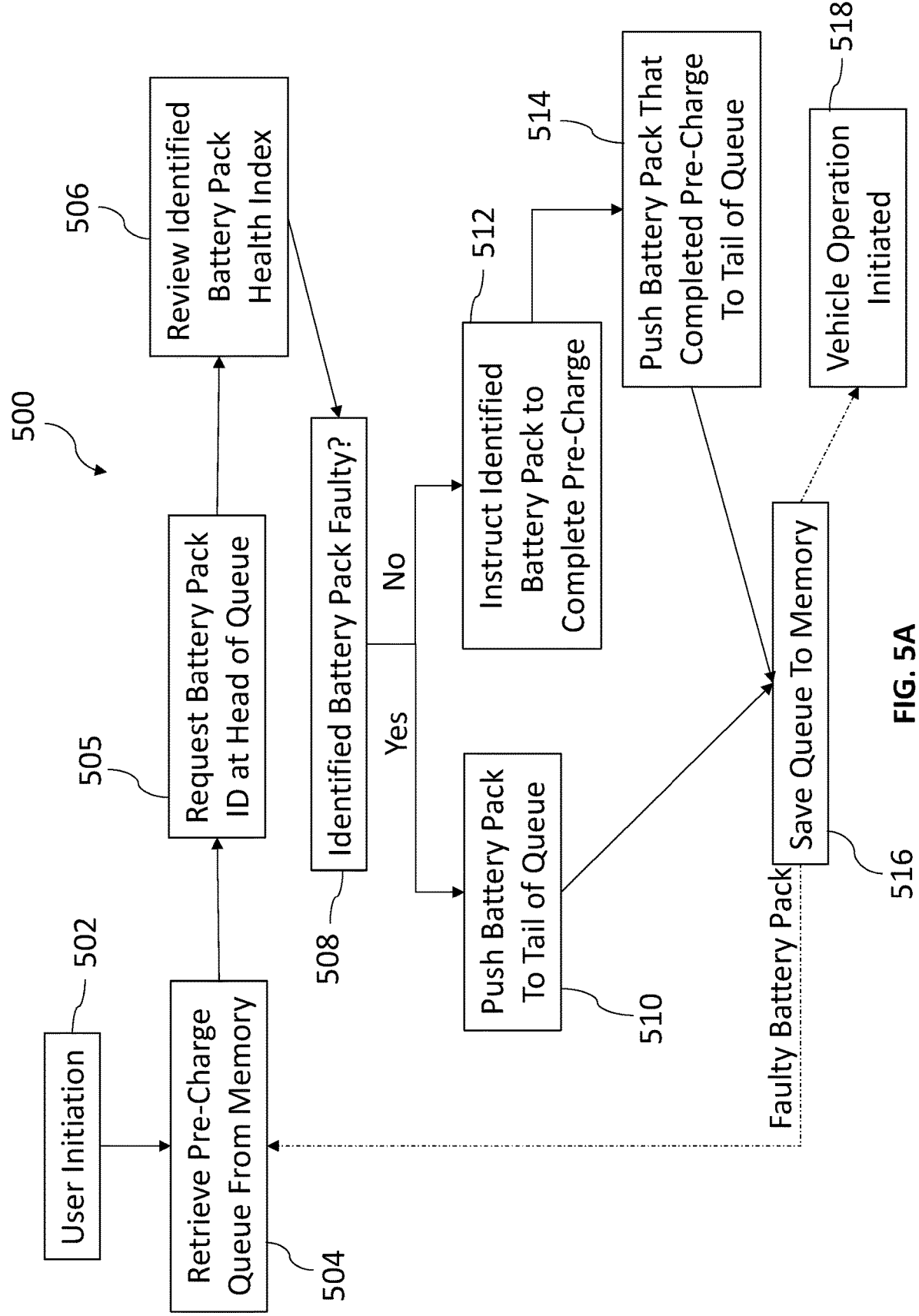
FIG. 5A illustrates another exemplary method of the present disclosure for selecting a battery pack from a plurality of battery packs connected in parallel to complete pre-charge of a high-voltage DC bus during subsequent vehicle operation initiations by the user, wherein a controller reviews a health index of each battery pack of the plurality of battery packs.

In some embodiments, the controller 102 may pre-emptively identify any battery pack issues before the pre-charge event is initiated to avoid pre-charge failure. For example, referring to FIG. 5A in view of the components of FIGS. 1 and 3, method 500 is provided for completing subsequent DC bus pre-charge events, following the initial DC bus pre-charge event method 200 of FIG. 2, wherein the controller 102 conducts a review of the battery pack health index of the selected battery pack 106 before initiating the pre-charge of the DC bus.

Method 500 begins with a user initiation at box 502, wherein the user initiation 502 is similar to the user initiation 402 of method 400 and user initiation 202 of method 200. At box 504, the controller 102 retrieves the pre-charge queue (i.e. any of queues 302, 304, 306 or another, subsequent queue) from the memory 104 and further requests the identification of the battery pack 106 at the head 308 of the queue. The controller 102 then conducts a review of the health index of the identified battery pack 106 at box 506. If the identified battery pack 106 is determined to be faulty at box 508, the identified battery pack 106 is pushed to the tail 310 of the queue at box 510, resulting in a subsequent queue that is saved to the memory 104 at box 516. The method 500 then restarts at box 504 until the pre-charge event is successfully completed as described further herein.

If the identified battery pack 106 is determined not to be faulty at box 508, the controller 102 instructs the identified battery pack 106 to complete the pre-charge of the DC bus at box 512. The battery pack 106 is then pushed to the tail 310 of the queue at box 514, resulting in a subsequent queue that is saved to the memory 104 at box 516. Once the pre-charge event is successfully completed, the contactors of the remaining operable battery packs 106 are closed to allow vehicle operation at box 518 as discussed above.

Figure 5B:
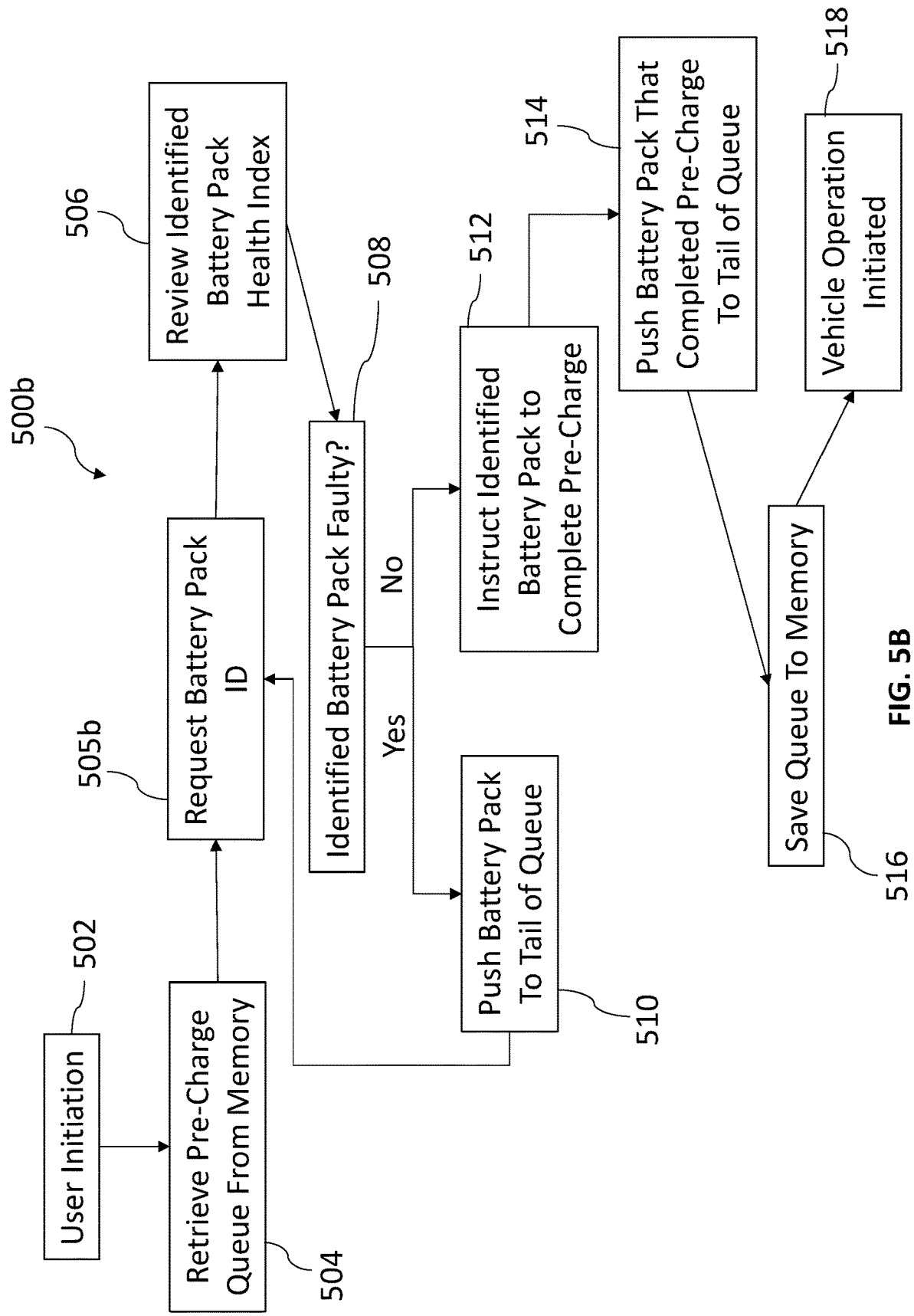
FIG. 5B illustrates another embodiment of the exemplary method of FIG. 5B.

In some embodiments, as shown by FIG. 5B, a method 500b may be utilized. Method 500b is substantially the same as method 500 illustrated by FIG. 5A, with the exceptions described herein. In method 500b, if the battery pack has been identified as faulty at box 508, the processor 102 may immediately retrieve identification of the next battery pack 106 at box 505b, which simultaneously pushes the faulty battery pack 106 to the tail 310 of the queue as shown at box 510. The method 500b repeats until an operable battery pack 106 is identified at box 508. Once an operable battery pack is identified, the remainder of method 500b follows the same steps as method 500 as discussed above.

While the invention has been described by reference to various specific embodiments it should be understood that numerous changes may be made within the spirit and scope of the inventive concepts described, accordingly, it is intended that the invention not be limited to the described embodiments but will have full scope defined by the language of the following claims.

What is claimed is:

1. A system for selecting a battery pack of a vehicle, the system comprising:
   a plurality of battery packs connected to each other in parallel;
   a controller operably coupled to the plurality of battery packs;
   a memory operably coupled to the controller; and
   a DC bus operably coupled to the plurality of battery packs, so that at least one of the plurality of battery packs is configured to selectively pre-charge the DC bus in a DC bus pre-charge event;

wherein the controller is configured to assemble a queue according to usage of the plurality of battery packs to pre-charge the DC bus, the queue saved to the memory for subsequent pre-charge of the DC bus during a subsequent DC bus pre-charge event.

2. The system of claim 1, wherein a head of the queue includes a battery pack of the plurality of battery packs having a lowest state-of-charge than remaining battery packs.

3. The system of claim 1, wherein the controller is configured to receive the saved queue from the memory for the subsequent DC bus pre-charge event.

4. The system of claim 1, wherein the controller is configured to receive a health index of any of one battery pack of the plurality of battery packs to determine if any one battery pack of the plurality of battery packs is faulty.

5. The system of claim 1, wherein a different queue is assembled after every DC bus pre-charge event relative to an immediately previously used queue.

6. A method for selecting a battery pack for a vehicle, the method comprising:
retrieving a queue from a memory;
requesting an identification of a battery pack positioned at a head of the queue;
instructing the identified battery pack to complete pre-charge of a DC bus;
pushing the identified battery pack to a tail of the queue to create a second queue; and
saving the second queue to the memory.

7. The method of claim 6, further comprising determining whether the pre-charge of the DC bus was successfully completed.

8. The method of claim 7, wherein the pre-charge of the DC bus is not successfully completed, further comprising:
retrieving the second queue from the memory;
requesting a second identification of a second battery pack positioned at a head of the second queue;
instructing the second battery pack to complete pre-charge of the DC bus;
determining whether the pre-charge of the DC bus was successfully completed;
pushing the second battery pack to a tail of the second queue to create a third queue;
saving the third queue to memory; and
repeating until the pre-charge of the DC bus is successfully completed.

9. The method of claim 7, wherein the pre-charge of the DC bus is successfully completed, further comprising initiating operation of the vehicle.

10. The method of claim 6, further comprising reviewing a health index of the identified battery pack prior to instructing the identified battery pack to complete pre-charge of the DC bus to determine whether the identified battery pack is faulty.

11. The method of claim 10, wherein the identified battery pack is faulty, further comprising:
requesting a second identification of a second battery pack positioned at a head of the second queue;
reviewing a health index of the second battery pack; and
determining whether the second battery pack is faulty.

12. The method of claim 11, wherein the second battery pack is faulty, further comprising: pushing the second battery pack to a tail of the second queue to create a third queue and repeating until an operable battery pack is identified.

13. The method of claim 10, wherein the identified battery pack is operable, further comprising initiating vehicle operation after the pre-charge of the DC bus is completed.

14. A method for selecting a battery pack for a vehicle, the method comprising:
identifying a battery pack of a plurality of battery packs having a lowest state-of-charge than remaining battery packs;
instructing the identified battery pack to pre-charge a DC bus;
storing the identified battery pack within a memory;
creating a queue, wherein the identified battery pack is positioned at a head of the queue; and
pushing the identified battery pack to a tail of the queue to create a subsequent queue.

15. The method of claim 14, further comprising reviewing a health index of the identified battery pack to determine whether the identified battery pack is faulty.

16. A controller of a vehicle operably coupled to a plurality of battery packs, the controller configured to:
assemble a queue according to usage of the plurality of battery packs;
identify a battery pack positioned at a head of the queue;
instruct an identified battery pack to complete pre-charge of a DC bus; and
push the identified battery pack to a tail of the queue to create a second queue.

17. The controller of claim 16, wherein the controller is further configured to determine whether the pre-charge DC bus was successfully completed.

18. The controller of claim 17, wherein the pre-charge of the DC bus is not successfully completed and the controller is further configured to identify a second battery pack at a head of the second queue.

19. The controller of claim 16, wherein the controller is further configured to review a health index of the identified battery pack prior to instructing the identified battery pack to complete pre-charge of the DC bus to determine whether the identified battery pack is faulty.

20. The controller of claim 16, wherein the controller is further configured to identify a single battery pack of the plurality of battery packs having the lowest state-of-charge and place the single battery pack at the head of the queue.

21. The method of claim 14, further comprising retrieving the second queue from memory for subsequent pre-charge of the DC bus.

22. The controller of claim 16, wherein the second queue is saved to a memory for subsequent pre-charge of the DC bus.

* * * * *